US012666563B2

(12) United States Patent
Whitehead et al.

(10) Patent No.: US 12,666,563 B2
(45) Date of Patent: Jun. 23, 2026

(54) COOLING OF ELECTRONIC DISPLAYS

(71) Applicant: AMSCREEN GROUP Ltd., Bolton (GB)

(72) Inventors: Stephen Whitehead, Edgworth Bolton (GB); Jonathan Shires, Bolton (GB); Gary Greenwood, Bolton (GB)

(73) Assignee: BAUER MEDIA OUTDOOR TECHNIC LIMITED, Bolton (GB)

( * ) Notice: Subject to any disclaimer, the term of this patent is extended or adjusted under 35 U.S.C. 154(b) by 0 days.

(21) Appl. No.: 18/730,200

(22) PCT Filed: Jan. 17, 2023

(86) PCT No.: PCT/GB2023/050079
§ 371 (c)(1),
(2) Date: Jul. 18, 2024

(87) PCT Pub. No.: WO2023/139356
PCT Pub. Date: Jul. 27, 2023

(65) Prior Publication Data
US 2025/0120041 A1 Apr. 10, 2025

(30) Foreign Application Priority Data

Jan. 18, 2022 (GB) ..................................... 2200563

(51) Int. Cl.
*H05K 7/20* (2006.01)
(52) U.S. Cl.
CPC ..... *H05K 7/20181* (2013.01); *H05K 7/20209* (2013.01); *H05K 7/20972* (2013.01)

(58) Field of Classification Search
CPC ........... H05K 7/20972; H05K 7/20145; H05K 7/20181; H05K 7/20209; H05K 7/202;
(Continued)

(56) References Cited

U.S. PATENT DOCUMENTS 6,198,222 B1 * 3/2001 Chang ................ H05K 7/20972
313/46
7,667,964 B2 * 2/2010 Kang ................ G02F 1/133308
313/582
(Continued)

FOREIGN PATENT DOCUMENTS

CN 212064555 12/2020
EP 1726888 A1 * 11/2006 ............ F24F 1/0073
(Continued)

OTHER PUBLICATIONS

WO-2007116116; Karppanen et al. Electronic Information Board, Search English translation (Year: 2007).*
(Continued)

*Primary Examiner* — Michael A Matey
(74) *Attorney, Agent, or Firm* — GrayRobinson, P.A.

(57) ABSTRACT

An electronic display includes a housing and a display panel having a display surface that is visible through the housing. An inlet is provided to allow external air into the housing and an outlet is provided to allow external air out of the housing. There is a closable vent at the inlet or outlet and a temperature sensor. A controller is arranged to control opening and closing of the vent in response to the output of the temperature sensor.

6 Claims, 5 Drawing Sheets

(58) Field of Classification Search
CPC .......... H05K 5/03; H05K 7/1488; H05K 7/20; H05K 7/20154; H05K 7/20736; H05K 7/20963; H05K 7/20954; G02F 1/133385; G02F 2201/36; G02F 1/133308; G02F 1/133342; G02F 1/133382; G02F 1/133628; G02F 1/133608; G02F 1/133331; G06F 1/20; G06F 1/1601; G06F 1/206; G06F 1/16; G09F 9/3026; G09F 13/0413; G09F 13/0445; Y10S 248/917
See application file for complete search history.

(56) References Cited

U.S. PATENT DOCUMENTS

| | | | | |
|---|---|---|---|---|
| 8,351,014 | B2* | 1/2013 | Dunn ................. | H05K 7/20972 |
| | | | | 349/161 |
| 11,096,317 | B2* | 8/2021 | Dunn ................ | G02F 1/133385 |
| 2009/0174626 | A1* | 7/2009 | Isoshima ............ | H05K 7/20972 |
| | | | | 345/55 |
| 2011/0051071 | A1* | 3/2011 | Nakamichi .......... | G06F 1/1601 |
| | | | | 349/161 |
| 2011/0058326 | A1* | 3/2011 | Idems ...................... | G09F 9/30 |
| | | | | 361/679.21 |
| 2011/0085302 | A1* | 4/2011 | Nakamichi ........ | H05K 7/20972 |
| | | | | 361/695 |
| 2015/0009625 | A1* | 1/2015 | Chin .................. | H05K 7/20145 |
| | | | | 361/695 |
| 2017/0074453 | A1* | 3/2017 | Bowers ..................... | E04H 1/14 |
| 2017/0083062 | A1 | 3/2017 | Bowers et al. | |
| 2021/0341783 | A1* | 11/2021 | Ahn .................. | G02F 1/133314 |
| 2022/0252927 | A1* | 8/2022 | Wang ................ | G02F 1/133342 |

FOREIGN PATENT DOCUMENTS

| | | |
|---|---|---|
| KR | 20160016564 A | 2/2016 |
| WO | 2012091530 A1 | 7/2012 |
| WO | 2013133614 A1 | 9/2013 |

OTHER PUBLICATIONS

Examination and Search Report of Jun. 15, 2022 for GB2200563.1.
International Search Report of Jul. 4, 2023 for PCT/GB2023/050079.

\* cited by examiner 10
3
1
1
2
60
4
5
FIG. 1
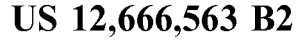
FIG. 2
60
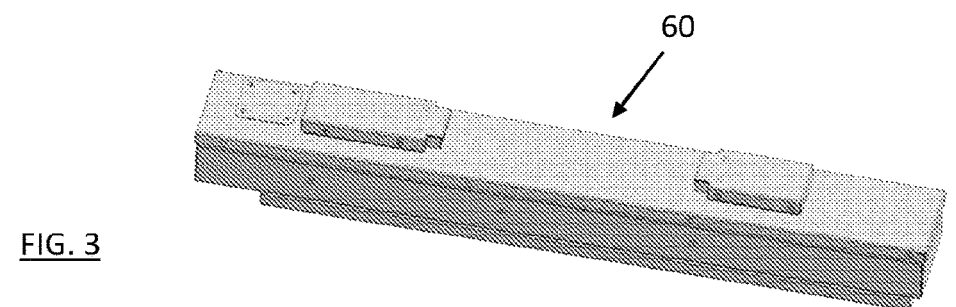
FIG. 3

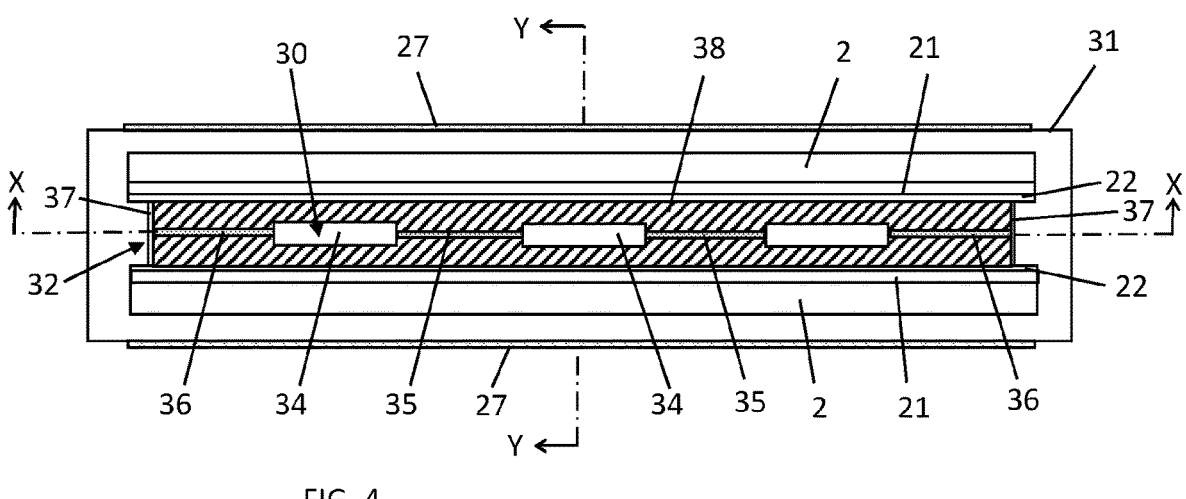
FIG. 4
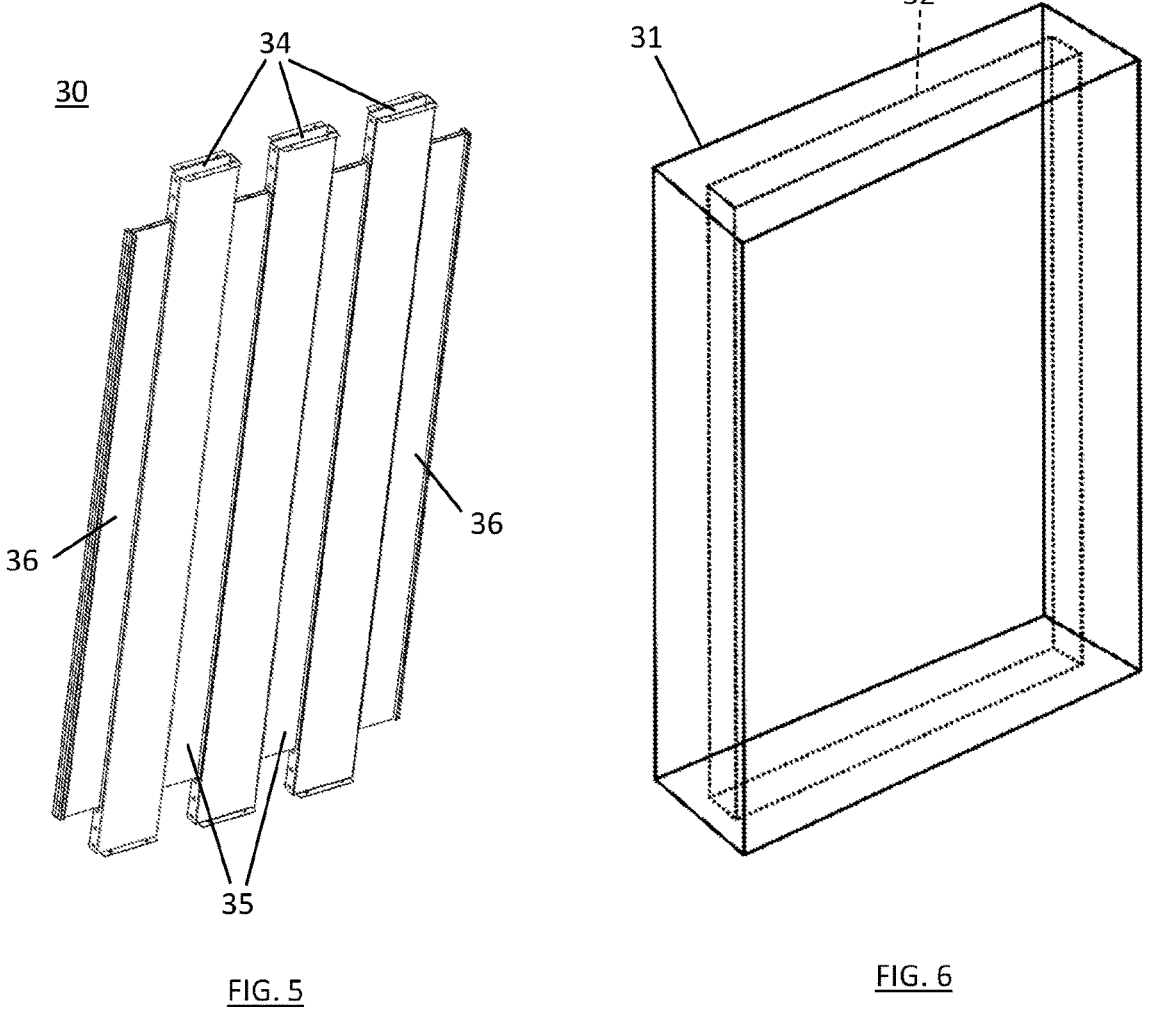
FIG. 5
FIG. 6

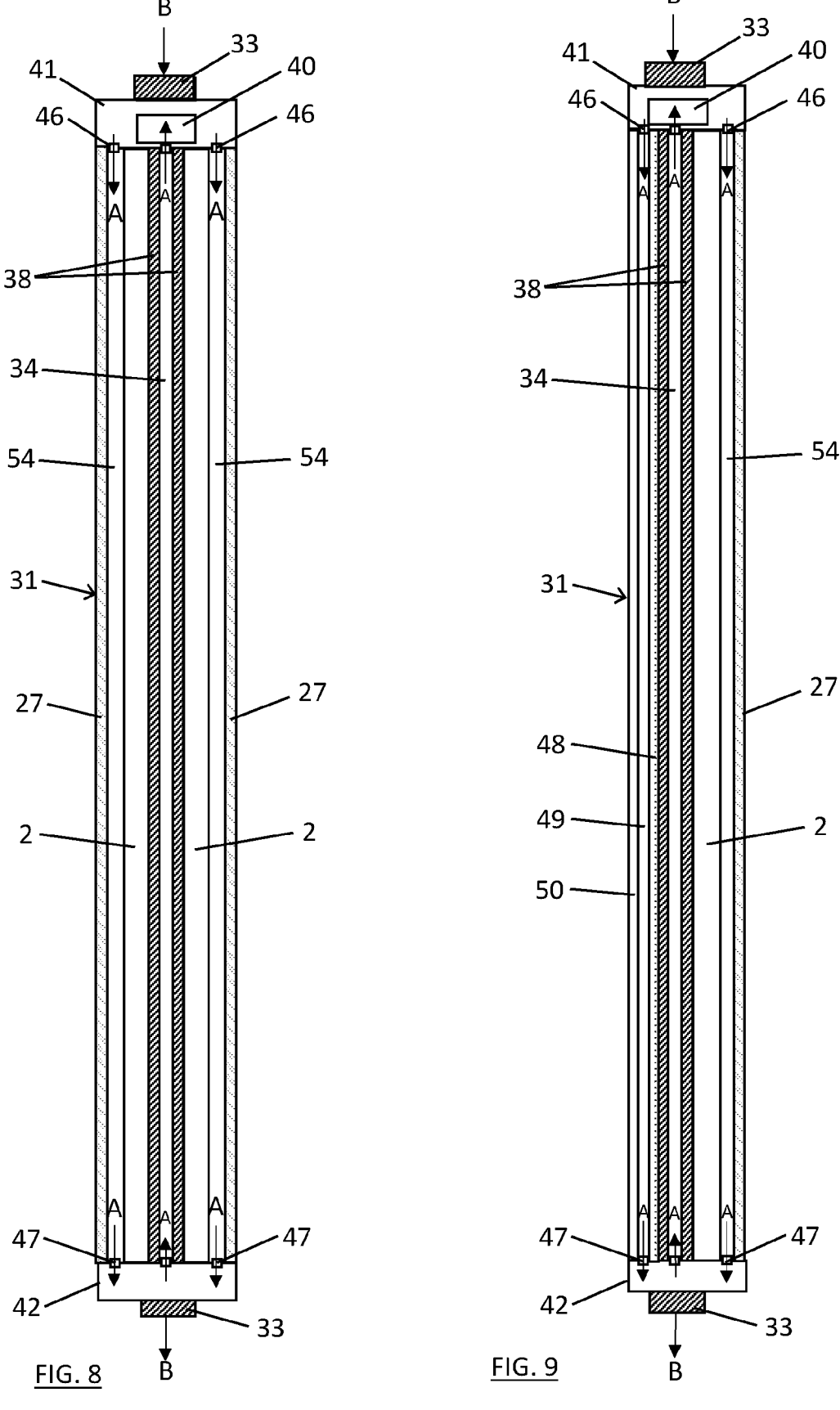
FIG. 8                    FIG. 9

COOLING OF ELECTRONIC DISPLAYS

CROSS-REFERENCE TO RELATED APPLICATIONS

This is the U.S. National Stage application of International Application No. PCT/GB2023/050079, filed Jan. 17, 2023, which claims the benefit of priority from GB 2200563.1, filed Jan. 18, 2022. The entire contents of these prior applications are incorporated by reference.

BACKGROUND

The present invention relates to the cooling of electronic displays, and includes the cooling of electronic control assemblies for electronic displays. The invention is concerned particularly, although not exclusively, with large-scale electronic displays that incorporate heat-exchangers. In the context of this specification, "large-scale" means a minimum visible screen size of approximately 50 inches (127 cm), measured diagonally across the screen.

Crossflow Heat Exchanger arrangements (heat exchanger or similar fabrication) have been traditionally used for cooling large outdoor advertising screens. See, for example, our Patent GB2565997B and others.

Improving the efficiency of crossflow heat exchangers often leads to complex arrangements for air flow control and management (air speeds, flow directions, etc). For example, this might require the redirection of incoming cool ambient air to various areas of a large display or various cooling chambers, using ducting and fan arrangements to maximise the use of cool air within the display.

Heat exchangers often have limited size, occupying only a partial display screen area. This may require the use of multiple heat exchangers or cooling chambers to optimise differential air temperature between internal and external air flows across the display area. As a result, this can lead to complex arrangements, requiring many fans, cooling chambers and ducting to reach as much of the heat generating areas as possible. Thus, there may be severe spatial constraints and volumetric inefficiencies, as a lot of space is required to house such components, resulting in a bulky product.

There can be challenges to cooling sensitive electronics, where key components are housed within the same structure as one or more display panel, and cooled from common cooling sources (e.g. common inlets and exhausts). More fans and ducting arrangements lead to more complex and costly manufacturing procedures. This may present not only increased costs, but the potential for quality issues—e.g. ensuring that arrangements are fully sealed between isolated areas, mechanical failure over time of components such as seals, fans, etc.

Cooling arrangements can lead to more complex display panel/backlight arrangements to help remove heat—e.g. by passing cooling air between an LCD panel and backlight.

Dedicated heat exchangers and complex/inefficient crossflow arrangements often require greater depth. This results in deeper displays and increased weight, especially for back-to-back units. Depth of displays is also compounded where controlling electronics are located in cooling ambient (external) or internal air chambers behind backlights.

Increasingly hotter climates and the demand for higher brightness displays is placing increasingly higher demands on cooling systems.

BRIEF SUMMARY

Preferred embodiments of the present invention aim to provide electronic displays that may be improved in the foregoing respects.

According to one aspect of the present invention, there is provided an electronic display comprising:
a housing;
a display panel within the housing and having a display surface that is visible through the housing;
an inlet to allow external air into the housing;
an outlet to allow external air out of the housing;
a closable vent at said inlet or outlet;
a temperature sensor; and
a controller arranged to control opening and closing of said vent in response to the output of said temperature sensor.

Preferably, the electronic display further comprises a heat exchanger that provides:
a first path through which internal air is circulated, in use, to cool the display panel;
a second path through which external air passes, in use, without mixing with said internal air; and
heat exchange between said internal and external air, in use.

Preferably, said inlet and outlet are at the top and bottom of the display.

Preferably, the electronic display further comprises a heater arranged to heat the internal air and/or external air within the display.

In another aspect, the invention provides an electronic display comprising a housing; a display panel within the housing and having a display surface that is visible through the housing; and a heat exchanger within the housing, adjacent to the display panel: wherein
the display panel is in a first substantially sealed enclosure through which internal air is circulated, in use, to cool the display panel;
the heat exchanger comprises a plurality of tubes in a second substantially sealed enclosure;
at least one first fan is arranged to circulate the internal air through or around the plurality of tubes to cool the internal air, the air flowing in a first direction;
at least one second fan is arranged to pass external air around or through the plurality of tubes to cool them, the air flowing in a second direction; and
the second direction is substantially opposite to or the same as the first direction.

Preferably, the tubes of the heat exchanger are substantially parallel to one another.

Preferably, the tubes of the heat exchanger are substantially upright.

Preferably, the heat exchanger extends from or adjacent one edge of the display panel to the other.

Preferably, the tubes of the heat exchanger are interconnected by thermally conductive connecting elements.

Preferably, thermally conductive elements extend from outermost tubes to the edges of the heat exchanger.

Preferably, the first enclosure includes a part of the housing in which electronic control components are located and, in use, internal air passes over the electronic control components.

Preferably, the second enclosure includes a part of the housing in which electronic control components are located and, in use, external air passes over the electronic control components and then back into the second enclosure and/or out to the external surroundings.

Preferably, said part of the housing is a substantially upright part.

Preferably, the heat exchanger comprises a heat exchange unit, the width of which is between 80% and 100% of the overall width of the display panel.

Preferably, the heat exchanger comprises a heat exchange unit, the height of which is between 80% and 100% of the overall height of the display panel.

Preferably, the heat exchanger comprises a heat exchange unit, the two-dimensional area of which as seen in front elevation is between 65% and 100% of the two-dimensional area of the display panel as seen in front elevation.

Preferably, the electronic display further comprises a heater arranged to heat the internal air and/or external air within the display.

Preferably, said heater is disposed within a part of the display housing.

Preferably, the display panel has an associated backlight that is disposed within the first enclosure.

Preferably, there is no air flow path between the display panel and its associated backlight.

Preferably, the electronic display comprises two said display panels arranged back-to-back.

Preferably, the second enclosure is located within the first enclosure.

Preferably, wherein the internal air flows through the plurality of tubes and the external air flows around the plurality of tubes.

Preferably, the external air is introduced into a top region of the heat exchanger and internal air is introduced into a bottom region of the heat exchanger.

Preferably, in use, internal air flows over the front of the display panel.

Preferably, in use, external air flows over the rear of the display panel or an associated backlight or a plate in thermal contact with the display panel or associated backlight.

Preferably, the electronic display according to any of the preceding claims, being a large-scale electronic display.

In a further aspect, the invention provides an electronic display comprising a main housing; a display panel within the main housing and having a display surface that is visible through the main housing; and an electronics control assembly (ECA) that is arranged to control and manage the electronic display: wherein the ECA has its own ECA housing that is separate from the main housing in which the display panel is located; the ECA housing is provided with its ECA own cooling system that is separate from the main housing in which the display panel is located; and electrical connections are provided between the main housing and ECA housing.

Preferably, the ECA housing has a first compartment in which components of the ECA are mounted, the first compartment being substantially sealed.

Preferably, a fan is provided inside said first compartment and is arranged to circulate air within said first compartment.

Preferably, at least one ECA component that generates a larger amount of heat than other ECA components is secured to a wall of the first compartment.

Preferably, said at least one ECA component is secured to a wall of the first compartment via thermal paste and/or a copper or other metal heatsink.

Preferably, said at least one ECA component comprises a power supply unit and/or an embedded computer.

Preferably, the ECA housing has a second compartment in which cooling components are mounted, the second compartment being open to external air.

Preferably, said wall of the first compartment is secured to or forms a common wall with the second compartment.

Preferably, said cooling components comprise a channel heatsink and a fan; the channel heatsink being secured to a wall of the second compartment that is secured to or forms a common wall with the first compartment; and the fan being provided in the second compartment to draw external air into the second compartment and cause the external air to flow through channels of the heatsink and out of the second compartment into the external air around the second compartment.

Preferably, the wall of the second compartment to which the channel heatsink is secured, is secured to or forms a common wall with the wall of the first compartment to which said at least one ECA component that generates a larger amount of heat is secured.

Preferably, the electronic display comprises first and second channel heatsinks as aforesaid, the first heatsink being longer than the second heatsink and the fan of the second compartment being positioned between the first and second channel heatsinks.

Preferably, at least one ECA component that generates a larger amount of heat is located adjacent said second channel heatsink.

Preferably, the second compartment has a removable cover.

Preferably, the ECA housing is mounted adjacent to the main housing.

The ECA housing may be mounted at a distance from the main housing.

An electronics control assembly (ECA) of an electronic display according to any of the preceding aspects of the invention.

The invention extends to an electronic display according to any of the preceding aspects of the invention, in combination.

In the context of this specification, the term 'electronic display' includes one or more display panel and associated components.

In the context of this specification, 'internal air' means air that remains within an electronic display (subject to any minor leakage); and 'external air' or 'ambient air' means air that has been introduced into the display from externally of the display and is subsequently exhausted from the display.

BRIEF DESCRIPTION OF THE DRAWINGS

For a better understanding of the invention, and to show how embodiments of the same may be carried into effect, reference will now be made, by way of example, to the accompanying diagrammatic drawings, in which:

FIG. 1 is a perspective view of an electronic display according to one aspect of the invention;

FIG. 2 is a perspective view of an electronic display that is similar to that of FIG. 1, showing it with simple cladding;

FIG. 3 is a perspective view of an Electronics Control Assembly (ECA) as used in the electronic display of FIG. 1;

FIG. 4 is a transverse sectional view of the electronic display of FIG. 1, showing a counterflow heat exchange unit;

FIG. 5 is a perspective view of the counterflow heat exchange unit of FIG. 4;

FIG. 6 is a perspective view to illustrate in a diagrammatic fashion the juxtaposition of first and second enclosures of the electronic display of FIG. 1;

FIG. 8 is a sectional view of the electronic display of FIG. 1, taken on the line Y-Y of FIG. 4;

FIG. 9 is a view similar to FIG. 8, but showing an electronic display with a single display panel;

In the figures, like references denote like or corresponding parts.

DESCRIPTION

Figure 7:
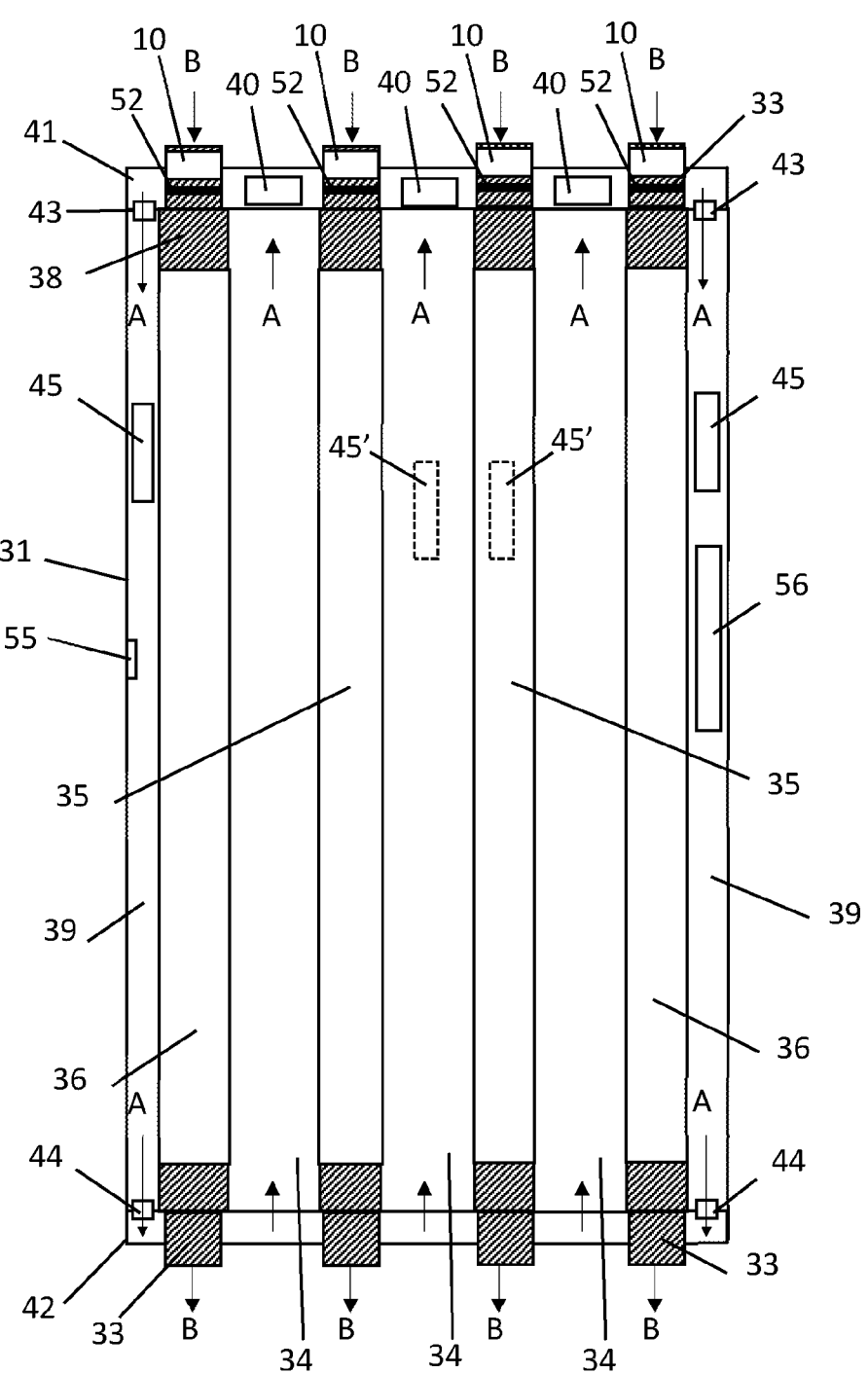
FIG. 7 is a sectional view of the electronic display of FIG. 1, taken on the line X-X of FIG. 4.

It is to be understood that the various features that are described in the following and/or illustrated in the drawings are preferred but not essential. Combinations of features described and/or illustrated are not considered to be the only possible combinations. Unless stated to the contrary, individual features may be omitted, varied or combined in different combinations, where practical.

The electronic display 1 that is shown in FIG. 1 is a large-scale display, having a visible screen size of 75 inches (190 cm) or more. The display 1 will be described in more detail below. However, as an overview, it has a pair of LCD display panels 2 arranged back to back and mounted in a housing 3 that is supported on legs 4 which, in turn, are mounted on a base plate 5.

There are other ways in which the display 1 may be mounted—for example, it may be wall mounted. The method of mounting is not an essential feature of the invention and therefore is not described further. Typically, the display 1 will have a plain or decorative cladding around the housing 3. FIG. 2 shows an example of a display 1 with a plain cladding. As such a cladding is not an essential feature of the invention, it is not described in further detail.

At the top of the display 1, four fans 10 are shown, to draw external or ambient air into the housing 3. There may be any alternative number of fans—e.g. 3, 5 or more. An Electronics Control Assembly (ECA) 60 is mounted below the display panels 2. We use the term 'Electrical Control Assembly' and its acronym 'ECA' to refer conveniently to an assembly of control elements that are arranged to control various aspects of an electronic display. The ECA 60 has its own enclosure, separate from the display panels 2. One example of an ECA 60 is shown in FIG. 2. Further features of such an ECA 60 are described later in the following description.

The internal configuration of the electronic display 1 is shown in the sectional view of FIG. 4. The two display panels 2 are arranged back-to-back, each having a display surface that is visible through the housing 3, via a respective glass 27 that is clamped and sealed to the housing 3. Each of the display panels 2 has a respective backlight 21 that fits closely to the display panel 2 and a rear metal plate 22 that is solid and fits closely to the respective backlight 21.

The housing 3 affords a first substantially sealed enclosure 31 through which internal air is circulated, in use, to cool the fronts of the display panels 2. By "substantially sealed" we mean an enclosure that contains the internal air, apart from any minor leakage. The display panels 2 and their backlights 21 are located within the first enclosure 31 and are cooled by the internal air flowing through it.

A second substantially sealed enclosure 32 for external air is located between the two backlights 21, and is bounded by the metal plates 22, side components 37, the bottom of an upper fan box or chamber 41 and the top of a lower box or chamber 42 (FIGS. 7 and 8). By "substantially sealed" we mean an enclosure that constrains external air to flow in a predetermined path, apart from any minor leakage. External air is indicated by hatched lines and reference numeral 38. A heat exchange unit 30 is located within the second enclosure 32. The second enclosure 32 and the heat exchange unit 30 within it together make up a heat exchanger, in which heat is exchanged between internal and external air.

As may be seen in FIGS. 4 and 5, the heat exchange unit 30 comprises three parallel, upright tubes 34 which, in this example, are of rectangular cross-section, but could be of alternative shapes—e.g. circular. The tubes 34 are optionally interconnected by thermally conductive plates 35. Additional thermally conductive side plates 36 are optionally connected to the outermost tubes 34. There may be any alternative number of tubes.

The diagrammatic view of FIG. 6 helps to visualise how the second enclosure 32 is located within the first enclosure 31. Internal air circulates within the first enclosure 31, whilst external air flows through the second enclosure 32, in which the heat exchange unit 30 of FIG. 5 is located.

Referring to FIGS. 7 and 8, fans 40 in the upper fan box 41 draw internal air up through the tubes 34—from the bottom to the top of the heat exchange unit 30 in this example—and into the upper fan box 41. Fans 10 draw external air into the second enclosure 32 via ducts 33 and force it downwardly in this example, over the tubes 34 and over the plates 35, 36. External air 38 is exhausted from the bottom of the second enclosure 32 in this example, via ducts 33, back into the ambient atmosphere surrounding the display 1.

In FIG. 8, in the interests of clarity, each reference numeral 2 denotes a respective display panel along with its backlight 21 and rear metal plate 22.

In FIGS. 7 and 8, the direction of airflow of internal air is indicated by arrows A and the direction of airflow of external air is indicated by arrows B.

Internal air (A) drawn upwardly by the fans 40 through the tubes 34 and into the upper fan box 41 circulates back downwardly through apertures 46 formed in the bottom of the upper fan box 41—the apertures 46 being shown diagrammatically in FIG. 8. The apertures 46 lead to spaces or channels 54 defined between the display panels 2 and their respective glasses 27. The internal air (A) continues to flow downwardly until it passes through apertures 47 (represented diagrammatically) in the top of the lower box 42. From the lower box 42, the internal air (A) flows upwardly through further apertures 47 into the bottom of the tubes 34, through the tubes 34 and back into the upper fan box 41 via apertures 46. The internal air (A) continues to circulate in this way, flowing over the fronts of the display panels 2 to provide cooling of the display panels.

As indicated above, external air (B) is drawn continuously into the top of the second enclosure 32 by the fans 10, which cause the external air to flow over the tubes 34 and panels 35, 36 of the heat exchange unit 30, before the external air is then exhausted through the bottom ducts 33. Where the external air (B) is cooler than the internal air (A)—which is a typical situation—it serves to cool the internal air as the external air 38 flows over and around the heat exchange unit 30.

As may be seen in FIGS. 4 and 8, external air 38 not only passes over and around the heat exchange unit 30, it passes over the metal plates 22 that are in close contact with the backlights 21 at the back of the display panels 2. As the metal plates 22 are thermally conductive, the external air 38 serves to provide cooling of the backlights 21 and thus further cooling also of the display panels 2.

Whilst the display panels 2 are shown in FIG. 4 as being in contact with their respective backlights 21, it is alternatively possible for there to be a gap between each display panel 2 and backlight 21. However, in such a case, internal air is not forcibly circulated through such a gap, which need not be sealed. Cooling of the display panels 2 is principally by internal air flowing over the fronts of the display panels 2 and, as just described above, by external air 38 flowing over the metal plates 22.

It may be appreciated that the heat exchange unit 30 is of relatively simple construction and may therefore be produced at relatively low cost. Nevertheless, it may be very effective. Because the internal and external air flows are in opposite directions, excessive variations may be avoided in the temperature differences between the internal and external air. That is, when internal air enters the bottoms of the tubes 34, it is at its warmest, having passed over the display panels 2. When the internal air is at the top of the tubes 34, it is at its coolest, having been cooled by heat exchange with the external air 38 via the heat exchange unit 30. When the external air is at the top of the heat exchange unit 30, it is at its coolest, having just been drawn into the second enclosure 32 via upper ducts 33, from outside the display 1. When the external air 38 is at the bottom of the heat exchange unit 30, it is at its warmest, having exchanged heat with the internal air via the heat exchange unit 30. Thus, at the bottom of the heat exchange unit 30, both the internal air and the external air are at their warmest. At the top of the heat exchange unit 30, both the internal air and the external air are at their coolest. Hence, variations in the temperature difference between internal air and external air at any point are minimised. This reduces the likelihood of hot spots or cold spots on the heat exchange unit 30. Since the temperature difference across this counterflow heat exchanger may be substantially constant, then this maximises the heat transfer from internal to external air.

Another significant feature of the illustrated embodiment is that the overall dimensions of the heat exchange unit 30, or of the second enclosure 32 that contains the heat exchange unit 30, are comparable to the overall dimensions of the display panels 2. This means that a single heat exchange unit 30 is sufficient to provide cooling of the display panels 2.

For example, as may be seen in FIG. 4, the overall width of the heat exchange unit 30, from left to right as seen, is a little less than the overall width of the display panels 2, from left to right as seen. As may be seen in FIG. 8, the overall height of the heat exchange unit 30, from top to bottom as seen, is substantially the same as the overall height of the display panels 2, from top to bottom as seen.

In more general terms, the overall width of the heat exchange unit 30, from left to right as seen, may be between 80% and 100% of the overall width of the display panels 2, from left to right as seen. The overall height of the heat exchange unit 30, from top to bottom as seen, may be between 80% and 100% of the overall height of the display panels 2, from top to bottom as seen.

Alternatively, the two-dimensional area of the heat exchange unit 30 as seen in front elevation (e.g. FIG. 7) may be between 65% and 100% of the two-dimensional area of the display panels 2 as seen in front elevation.

The above comments as to the width of the heat exchange unit 30 may alternatively apply to the width of the heat exchanger that is made up of the second enclosure 32 and the heat exchange unit 30. That is, even if the heat exchange unit 30 were to be less wide, the width or area of the second enclosure 32 would still bear a relationship to the width or area of the display panels 2, as set out above.

As best seen in FIG. 7, the housing 3 defines side compartments 39 that are part of the first enclosure 31. Local electronic control components 56 are conveniently located in the side compartments 39. Whilst most supply and control components are provided in the separate ECA 60, which is described in further detail below, the local control components 56 are provided where they need to be close to the display panels 2 or associated components.

In order to provide cooling of the local control components 56, a small amount of internal air is allowed to pass through upper bleed holes 43 in the upper fan box 41 and flow downwardly through the side compartments 39 and through lower bleed holes 44 in the lower box 42, where it mixes with the main internal airflow that is returned upwardly through the tubes 34. Further cooling may be provided by direct thermal contact of hot components 56 with the side wall of the housing 3, which in turn is in contact with surrounding ambient air.

Whilst the illustrated embodiment is intended principally for cooling of the display panels 2, there can be occasions when the ambient temperature is rather low and it is desirable to warm up the electronic display 1 either before or during a switch on sequence. To this end, one or more heater 45 can be provided conveniently in the side compartments 39 such that, with the internal air circulating via fans 40, but with the external air fans 10 temporarily switched off, the internal air may be warmed up by the heaters 45.

Although it may be convenient to locate heaters 45 in the side compartments 39, one or more heater 45 may be located in another part of the internal airflow—for example, in the upper fan box 41 and/or the lower box 42.

In an alternative configuration, instead of using internal air, external air may be bled from the main flow to pass through side compartments such as 39 and then be exhausted back into the ambient atmosphere, either with the main flow of external air or directly.

Whilst plates 35, 36 are shown as connecting and projecting from the sides of the tubes 34, connecting elements of alternative configurations may be employed. For example, in order to increase surface area, the plates 35, 36 may be of zigzag or undulating shape. The plates 35 and/or 36 may be replaced by further tubes for the passage of external air. The plates 35 and/or 36 may be omitted, for a simpler configuration.

Whilst the illustrated embodiment and above description refer to internal air passing through tubes 34 and external air passing over and around the tubes 34, an alternative configuration is for external air to pass through tubes such as 34 and internal air to pass over and around those tubes.

A particular advantage of the illustrated embodiment is that the electronic display 1 may be made relatively thin. Here, the counterflow configuration of the heat exchange unit 30 allows a much thinner construction than may be required with a crossflow heat exchanger which, by its very nature, tends to have a more three-dimensional construction. Also, as indicated above, as the overall outline of the heat exchange unit 30 and the second enclosure 32 is comparable to the overall outline of the display panels 2, just a single heat exchange unit 30 can provide adequate cooling for the display panels 2 and any local, associated components.

Moreover, it is of note that, in contrast to previous proposals, there is no forced air circulation between the display panels 2 and their respective backplates 21—further contributing to a relatively thin construction.

Whilst a counterflow configuration of the heat exchange unit 30 may be particularly advantageous, to obtain effective temperature differentials between internal and external air as mentioned above, alternative embodiments of the invention may adopt a parallel flow configuration, in which both internal and external air pass through and around the heat exchange unit 30 in the same direction. Such a configuration may contribute to making the electronic display 1 relatively thin.

Even with the counterflow heat exchange unit 30, a parallel flow configuration may be selectively adapted for use in cool environments. To this end, the external fans 10 are turned off, as has been mentioned above. As the external air 38 is heated by the heat exchange unit 30, it is caused to rise by convection and is outlet via the upper ducts 33. In this case, both the internal air and the external air flow in parallel through the heat exchange unit 30, from the bottom to the top of the display. External air enters through the lower ducts 33. With reference to FIG. 7, the direction of flow indicated by the arrows B is reversed.

This option allows for reduced cooling and so may be suitable for use in cool environments.

In yet cooler conditions, it may be desired to conserve heat within the electronic display 1 and/or to provide a certain amount of heating. To this end, the upper ducts 33 are provided with closable vents 52, to control the flow of external air 38.

With the external fans 10 turned off and the vents 52 closed, the flow of external air through the heat exchange unit 30 is substantially reduced or stopped. Heat generated within the electronic display 1—for example, by the back-light 21—is retained within the display. One or more heater 45 may be activated, according to needs. One or more additional or alternative heater 45' may be provided in or on the heat exchange unit 30—for example, on a tube 34 or plate 35, as indicated in FIG. 7. Other optional locations for heaters such as 45 include the upper and lower boxes 41,42. Internal air fans 40 may be activated or not, depending upon heating or cooling requirements.

The closable vents 52 may be controlled and adjusted to intermediate positions between fully open and fully closed, to adjust flow, whether or not the external fans 10 are activated. Closable vents such as 52 may additionally or alternatively be provided in the lower ducts 33.

Activation of the closable vents 52 and/or the external and internal fans 10, 40 may be in response to temperature sensors within or on the electronic display 1. An example of a temperature sensor 55 is shown in FIG. 7. This may sense temperature both within the display 1 and around it. Other locations for temperature sensors may include the upper and lower boxes 41,42. A control element in the ECA 60 may control the closable vents 52 and/or the external and internal fans 10, 40 in response to temperature sensors.

Although the embodiment of FIGS. 1 to 8 is for a dual display, other embodiments of the invention may apply to electronic displays with a single display panel. An example of this is shown in FIGS. 9 and 10 where, as compared to the preceding embodiment, like reference numerals indicate like or corresponding parts and thus the reader will readily understand the mode of operation of the embodiment of the single display unit of FIGS. 9 and 10.

In FIG. 9, in the absence of a second display panel 2, a solid metal plate 48 closes the second enclosure for external air 38 and another solid metal plate 50 closes the first enclosure for internal air, to define an internal airflow channel 49 between the solid metal plates 48 and 50. Thus, internal air (A) in the channel 49 gets cooled by heat exchange with both of the metal plates 48 and 50, the latter plate 50 being in contact with the ambient atmosphere.

In another configuration, in a dual display, one of the display panels 2 may be smaller than the other. For example, behind a main, large display panel 2, a rear display panel may be of 46-inch (117 cm) diagonal size provided as, say, a 'wayfinder' touch screen, where a user can find directions in the local vicinity.

Figures 10, 11, 12, 13:
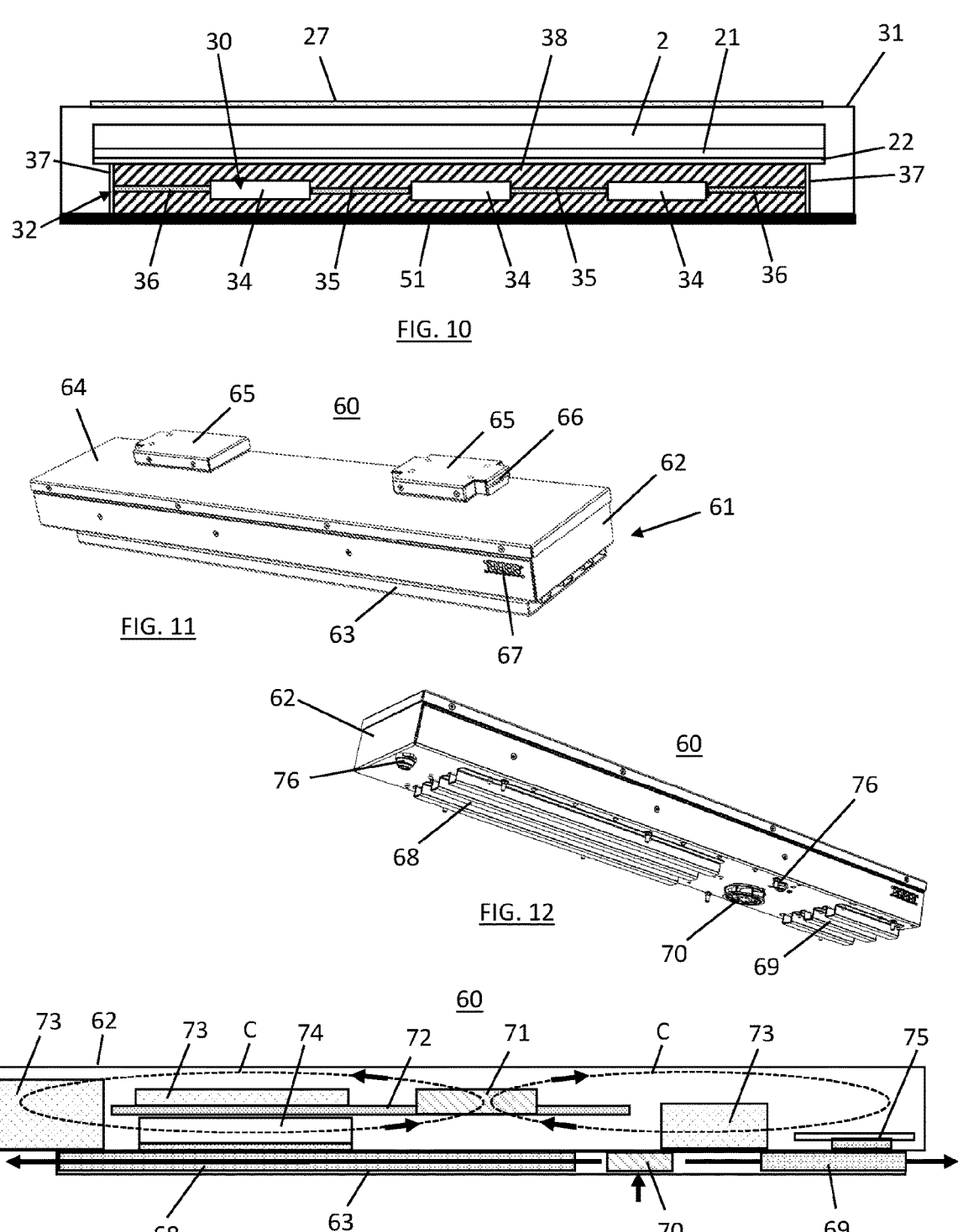
FIG. 10 is a view similar to FIG. 4, but showing an electronic display with a single display panel.
FIG. 11 is a top perspective view of an ECA similar to that of FIG. 2.
FIG. 12 is a bottom perspective view of the ECA of FIG. 11, with a bottom cover removed.
FIG. 13 is a diagrammatic sectional view of the ECA of FIGS. 11 and 12.

FIG. 10 shows a variant in which plates 48 and 50 of FIG. 9 are replaced with a single, solid metal plate 51, so that the channel 49 of FIG. 9 is dispensed with and all of the internal air is directed through the channel 54, over the front of the display panel 2—apart from any internal air that might bleed through side compartments 39. Thus, plate 51 serves to close off both the first enclosure 31 for internal air and second enclosure 32 for external air 38.

Electronic displays require an Electronics Control Assembly (ECA)—that is, an assembly of electrical and electronic components to control and manage the display including such aspects as thermal management, remote communications, I/O (sensors/control) management, LCD display control/management, power supplies, electrical protection, etc. All of these require space and cooling/temperature management for themselves, for sensitive components.

ECAs for electronic displays are typically located within the display assembly along with one or more display panel, and often behind or between backlights, which potentially adds to the overall depth of the display. ECAs may be located within ambient and/or internal air chambers and contribute heat to exacerbate LCD/Backlight cooling issues and/or require complex ducting arrangements to separate cooling and associated air flows from LCDs and/or backlights.

An ECA often connects to individual sensors for monitoring data points such as temperature, pressure, humidity, light etc, located within the display at location extremes such as the top and bottom of large displays. Such sensors are prone to noise/data corruption when connected over long distances. This results in a need to minimise the distance between the sensor and control electronics, which is why this often results in the ECA being centralised in areas behind backlights e.g. behind/between backlight/s.

As indicated above, the illustrated electronic display 1 has a separate ECA unit 60, located below the main assembly with the display panels 2. An example of the ECA unit 60 is shown in FIGS. 11 to 13.

The ECA unit 60 has its own dedicated enclosure 61 with its own cooling arrangement, separate from the assembly of display panels 2 and their own cooling arrangement within the first and second enclosures 31, 32. The ECA enclosure 61 comprises a first sealed compartment 62 and a second compartment 63 that is open to the ambient atmosphere. Both the first compartment 62 and the second compartment 63 are of a material that provides good thermal conduction—for example, of steel, aluminium or other metal.

The first compartment 62 has a removable cover 64 that is secured to the top (as seen) of the compartment 62 in an airtight manner. Two panels 65 are secured to the cover 64 in an airtight manner and are removable to afford access to nearby components within the first compartment 62. Each of the panels 65 is provided with a respective sealing gland 66 through which cables may pass to provide electrical connections between the ECA 60 and the main display assembly, within the first compartment 62. Alternatively or additionally, IP-rated connectors may be provided on the panels 65, cover 64 or compartment 62. If such IP-rated connectors are provided, it may not be necessary for a readily removable cover 64 to be provided.

LED indicators 67 indicate status of the ECA and may be used for programming and/or diagnostic purposes. Ports 76 with sealable glands are provided on the underside of the first compartment 62, as may be seen in FIG. 12. The ports may be for the connection of external power or other purposes.

The requirement for minimising data transfer distance can be eased by use of a local communication network—e.g. to allow slave sensors to be managed by a master in the ECA. An example of this may be found in our patent GB 2563987. Such an approach may facilitate a separate ECA, as a single network cable—e.g. a CANbus—may obviate the need for multiple cables between the ECA and a main display panel housing.

As may be seen in FIG. 12, where a bottom cover of the second compartment 63 is removed, channel heatsinks 68, 69 are secured to the underside of the first compartment 62. A radial flow fan 70 takes in external (ambient) air axially and causes it to flow radially outwards. With the lower cover of the second compartment 63 in place to bound and route external air, as in FIG. 13, the airflow caused by the fan 70 is along the channels of the heatsinks 68, 69, in mutually opposite directions. The air is exhausted from the ends of the heatsinks 68, 69, in opposite directions.

The diagrammatic view of FIG. 13 illustrates by arrows the external airflows through the second compartment 63, as just described. FIG. 13 also shows an axial flow fan 71 located in a central region of the first compartment 62, providing circulating air flows C within the first compartment 62. A baffle 72 serves to direct such circulatory airflow.

Various electrical and/or electronic components 73 are disposed within the first compartment 62. For example, a power supply 74 is secured to the base of the first compartment 62, with the use of thermal paste to promote thermal conduction. For example, an embedded computer with copper (or other metal) heatsink 75 is secured to the base of the first compartment 62, at an opposite end to the power supply 74. The power supply 74 and embedded computer are components that generate a larger amount of heat than other ECA components.

In use, the ECA 60 is connected to external power and to the main display unit via connectors in the first compartment 62, sealing glands 66 and ports 76. The fan 71 is operative to create a cooling airflow within the compartment 62. Cooling is effected with external air via the thermally conductive walls of the compartment 62, but principally via the airflow of external air through the heatsinks 68, 69, effected by the fan 70. The power supply 74 and computer with copper heatsink 75 are cooled principally by conduction via heatsink 75 and/or thermal paste to the heatsinks 68, 69.

Because of the asymmetrical configuration in which the heatsink 69 is shorter than the heatsink 68, external air will spend less time passing through the heatsink 69, before it is exhausted back into the ambient air. It will spend less time being heated, than air passing through the heatsink 68. Therefore, it is particularly efficient for the relatively short heatsink 69 to be positioned adjacent the PC with copper heatsink 75, which may be expected to produce the most heat. Components that may be expected to produce somewhat less heat are disposed adjacent the longer heatsink 68.

Whilst it may be expected that, for the most part, external air is used to cool the ECA 60, there may be times when the ECA and/or the external air is rather cool. Therefore, components such as 73 may comprise a heater that may be activated to warm up components within the first compartment 62, before and/or during start-up. At that time, the fan 70 may be switched off.

Providing an ECA 60 that is separate from the main display assembly has a number of advantages.

Of particular interest is reducing the thickness of the electronic display 1, because it is no longer necessary to position ECA components behind or between display panels 2 and/or backlights 21. Any control components 56 that must be closer to the display panels 2 and/or backlights 21 may be located in side compartments 39, as illustrated and described with reference to the previous figures.

The design and cooling of the main display assembly may be simplified, because the ECA 60 is located separately, with its own cooling arrangement.

Swap out of the ECA 60 becomes easy, for either servicing or updating.

Although the ECA 60 is shown in FIGS. 1 and 2 as being mounted below the main display assembly in a common structure, it could be located separately—for example, within a separate nearby pillar, or within a nearby building.

For a dual display as illustrated in FIGS. 1 to 8, a common ECA 60 may provide power and control for both display panels 2. However, if desired, a separate ECA 60 may be provided for each of the display panels 2. The use of a separate ECA 60 is equally applicable to a single display— e.g. as illustrated in FIGS. 9 and 10.

Although the illustrated embodiments of the invention are designed for use with ambient (external) air as coolant and internal air as heat-exchange medium, alternative fluids (gases or liquids) may be used as coolants or heat-exchange media.

In this specification, terms of absolute orientation are used conveniently to denote the usual orientation of items in normal use and/or as shown in the accompanying drawings. However, such items could be disposed in other orientations, and in the context of this specification, terms of absolute orientation, such as "top", "bottom", "left", "right", "vertical" or "horizontal", etc. are to be construed accordingly, to include such alternative orientations.

In this specification, the verb "comprise" has its normal dictionary meaning, to denote non-exclusive inclusion. That is, use of the word "comprise" (or any of its derivatives) to include one feature or more, does not exclude the possibility of also including further features. The word "preferable" (or any of its derivatives) indicates one feature or more that is preferred but not essential.

All or any of the features disclosed in this specification (including any accompanying claims, abstract and drawings), and/or all or any of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends to any novel one, or any novel combination, of the features disclosed in this specification (including any accompanying claims, abstract and drawings), or to any novel one, or any novel combination, of the steps of any method or process so disclosed.

The invention claimed is:

1. An electronic display comprising:
a housing;
a display panel within the housing and having a display surface that is visible through the housing;
a heat exchanger that provides: (a) a first path through which internal air is circulated to cool the display panel; (b) a second path through which external air passes without mixing with said internal air; and (c) heat exchange between said internal air and external air;
an inlet to allow external air into the heat exchanger;
an outlet to allow external air out of the heat exchanger;
a closable vent at said inlet or outlet;
a temperature sensor; and
a controller arranged to control opening and closing of said closable vent in response to an output of said temperature sensor, thereby to conserve heat generated within the display in cooler ambient conditions.

2. The electronic display of claim 1, wherein said inlet and outlet are at a top and a bottom of the electronic display.

3. The electronic display of claim 1, further comprising:
at least one first fan for circulating internal air through said first path; and
at least one second fan for passing air through said second path, from said inlet to said outlet;
wherein the controller is arranged to switch off said second fan when said closable vent is closed.

4. The electronic display of claim 1, wherein the controller is arranged to control and adjust the closable vent to intermediate positions between fully open and fully closed.

5. The electronic display of claim 1, comprising a plurality of said inlets and outlets and a plurality of said closable vents, each closable vent being provided at a respective said inlet or outlet.

6. The electronic display of claim 1, further comprising a heater arranged to heat the internal air and/or external air within the electronic display.

* * * * *